United States Patent [19]

Brooks et al.

[11] 4,257,007
[45] Mar. 17, 1981

[54] ACTIVE HIGH-POWER BANDPASS FILTER

[75] Inventors: James L. Brooks, Oxnard, Calif.; James C. Bowers; Harry A. Nienhaus, both of Tampa, Fla.

[73] Assignee: The United States of America as represented by the Secretary of the Navy, Washington, D.C.

[21] Appl. No.: 30,586

[22] Filed: Apr. 16, 1979

[51] Int. Cl.[3] .......................... H03L 7/06; H03K 9/08
[52] U.S. Cl. ...................................... 328/167; 330/10; 328/155
[58] Field of Search ............... 328/167, 155; 307/240; 330/10

[56] References Cited

U.S. PATENT DOCUMENTS

| 3,913,001 | 10/1975 | Kayama | 330/10 |
| 4,019,148 | 4/1977 | Shawhan | 328/167 |
| 4,059,807 | 11/1977 | Hamada | 330/10 |

Primary Examiner—John S. Heyman

Attorney, Agent, or Firm—Richard S. Sciascia; J. M. St.Amand; W. C. Daubenspeck

[57] ABSTRACT

An active power-line filter which provides bandpass filtering and transient suppression. The high-power signal to be filtered is modulated to form a chopped waveform within an envelope defined by the input waveform and the modulation is removed by passing the chopped signal through a low-pass filter. The output of the low-pass filter is then compared in a differential amplifier with a low-power reference signal which is phase-locked to the primary component of the high-power signal. The output of the differential amplifier is phase-compensated for the effects of the low-pass filter and is compared to the reference in a phase-detection multiplier to produce an error signal to adjust the duty cycle of the chopped waveform so that the waveform at the output of the low-pass filter is identical to the reference waveform. For periods when the high-power signal is out of phase with its primary component, the polarity of the high-powered signal is reversed at the input of the active filter to allow the filter to compensate for this situation.

8 Claims, 12 Drawing Figures

ACTIVE HIGH-POWER BANDPASS FILTER

BACKGROUND OF THE INVENTION

This invention relates in general to power line filtering techniques and more particularly to an active technique for providing bandpass filtering and transient suppression in power lines.

In the past, electromagnetic interference (EI) power line filters have used large capacitors and inductors in various series and parallel combinations to provide high-frequency filtering. For power lines carrying heavy currents (100 amps), the size of the inductors is limited by heating losses and the voltage drop across the inductors and the size of the capacitors is limited by the tolerable reactive current shunted to ground. In general, a compromise is made with the result that the filter is ineffective at low frequencies and becomes effective only for frequencies in excess of 1 KHz. When transient protection is desired, it must be provided by another device tacked onto the conventional EMI filter.

SUMMARY OF THE INVENTION

It is therefore an object of the present invention to provide a power filter having a frequency response approximating the ideal one hertz bandpass.

Another object of the present invention is to provide a power filter having improved transient suppression.

Another object of the present invention is to provide a high-power narrowband filter while minimizing attenuation losses.

A further object of the present invention is to provide a power filtering technique which reduces the need for large passive components.

These and other objects are accomplished in the present invention by a phase-locked loop technique in which a relatively low-frequency, high-power, waveform (for example, 60 Hz plus interference) to be filtered is chopped at a relatively high frequency (for example, 20 KHz) to form a high-frequency signal within a low-frequency envelope. The chopped waveform is passed through a low-pass filter which eliminates the high-frequency component and provides (at the output) a signal which is proportional to the instantaneous average value of the signal at the output of the chopper. An error signal is derived when the output of the low-pass filter is compared with a stable low-power reference signal which is phase-locked to the primary component of the low-frequency input signal. This error signal controls the duty cycle of the chopped waveform so that the output of the low-pass filter is a high-power waveform which is identical to the reference waveform.

Other advantages and novel features of the invention will become apparent from the following detailed description of the invention when considered in conjunction with the accompanying drawing wherein:

DESCRIPTION OF THE PREFERRED EMBODIMENT

Figure 1:
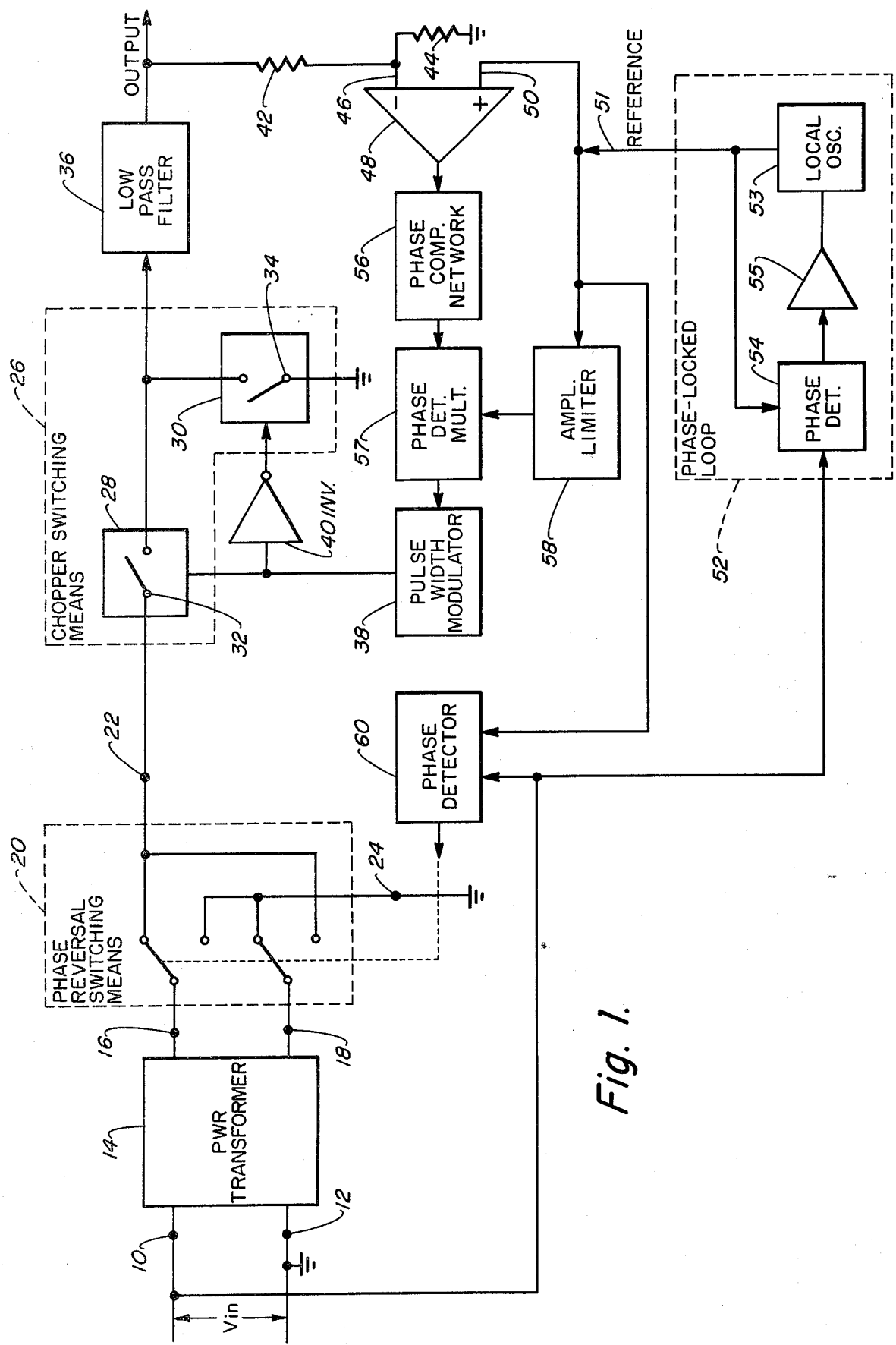
FIG. 1 is a schematic block diagram of an embodiment of the active bandpass filter of the present invention.
Figure 8:
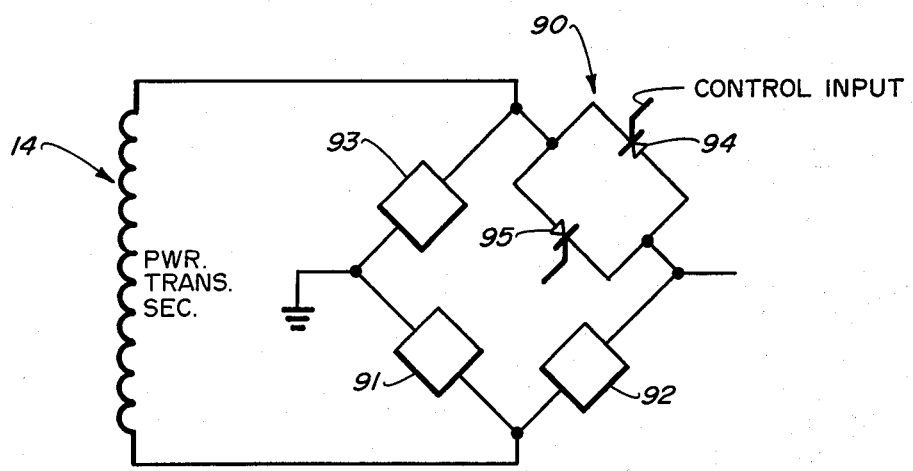
FIG. 8 illustrates an arrangement of unidirectional switches suitable for use as the phase reversal switching means in the embodiment of FIG. 1.

Referring now to the drawing and, more particularly to FIG. 1 which illustrates the preferred embodiment of the present invention, a high power signal $V_{in}$ to be filtered is applied to input terminals 10 and 12 of a 1:2 step-up power transformer 14. High power signal 10 may, for example, be a high-power, 60 Hz input signal plus various types of electromagnetic interference. As will be apparent from the following description, step-up transformer 14 is required at the input (or output) of the system because the nominal amplitude of the output voltage of the system without the transformer is equal to one-half that of the input voltage. The output of the power transformer 14 is coupled to input terminals 16 and 18 of phase reversal switching means 20. The phase reversal switching means 20, shown schematically in FIG. 1, functions as a bidirectional (i.e., non-rectifying) double-pole, double-throw switch to allow the polarity of the signal applied to the input terminals 16 and 18 to be reversed at output terminals 22 and 24 in certain circumstances which will be explained hereinafter. An arrangement suitable for use as phase reversal switching means 20 is shown in FIG. 8 and also will be described hereinafter.

The signal from the phase reversal switching means 20 is applied to a chopper switching means 26 (chopper) including a pair of bidirectional power switches 28 and 30. (See also FIG. 7.) Output terminal 22 of the phase reversal switching means 20 is coupled to an input terminal 32 of the first power switch 28. The output of first power switch 28 is coupled to the output terminal 34 of the second power switch 30 and to a low-pass filter 36. (See also FIG. 6.) The input of the second power switch 30 is coupled to the system ground 37 (as is output terminal 24 of phase reversal switch 20). The control inputs of power switches 28 and 30 are coupled to the output of a pulse-width-modulated oscillator 38, with the control input of the second power switch 30 being coupled to the modulator output via an inverter 40 so that the power switches have opposite switching states and are alternately switched on and off by the modulator output. Thus, the input to low-pass filter 36 is alternately coupled to the output of the first power switch 38 and the second power switch 30.

The output of low-pass filter 36 (which is the system output) is fed, via a resistor 42 of a voltage divider including resistors 42 and 44 to a first input 46 of a differential amplifier 48. The second input 50 to the differential amplifier 48 is coupled to a reference signal 51 which is phase-locked to the primary component (60 Hz) of the input signal $V_{in}$ using conventional phase-locked loop techniques represented by block 52. The phase-locked loop 52 typically includes a local oscillator 53 which has its output fed back as an input to a phase detector 54 having its other input coupled to the primary component of the input signal $V_{in}$ and its output coupled via an amplifier 55 to control the phase of local oscillator 53.

The output of the differential amplifier 48 is fed to a phase compensation network 56 which adjusts the phase of the signal to compensate for the phase shift due to the low-pass filter 36. The output of the phase compensation network 56 is coupled to one input of a phase detection multiplier 57 which has its other input coupled to the output of an amplitude limiter 58 which has its input coupled to the reference signal 51. The output of the phase detector multiplier 54 is coupled to the pulse-width-modulated oscillator to adjust the duty cycle of the oscillator.

The phase-locked reference 51 and the primary component of the input signal are also coupled to a phase detector 60 which is connected to control the state of the phase reversal switching means 20.

Figure 2:
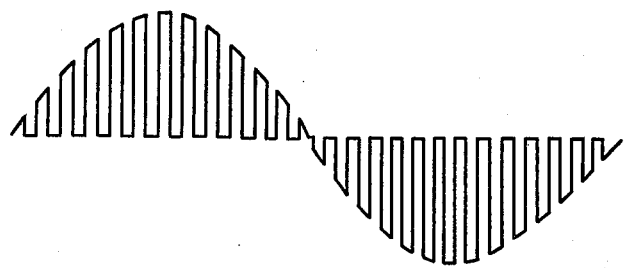
FIG. 2 is a waveform illustrating the output of the chopper switching means in the preferred embodiment.

The operation of the system will now be described for the case where the system input signal $V_{in}$ is a 60 Hz, 120 volts, 100 amp signal plus interference. The signal $V_{in}$ is stepped-up in voltage to 240 volts in the transformer 14 and passes through phase reversal switching means 20 which is normally positioned as shown in FIG. 1. The 60 Hz signal plus interference is chopped by the power switches 28 and 30 (of chopper switching means 26) which are alternately switched on and off by the pulse-width-modulated oscillator 38 which may conveniently be driven at 20 KHz. The unmodulated duty cycle of the oscillator 38 is one-half so that, with no interference present, the output of chopper 26 is as shown in FIG. 2, except that the chopper frequency has been greatly reduced for clarity. The 20 KHz chopper frequency is removed from the 60 Hz signal by the low-pass filter 36.

The output of low-pass filter 36 is proportional to the instantaneous average value of the chopped input, which is equal to the instantaneous value of the envelope times the instantaneous value of the chopper duty cycle. In other words, pulse-width-modulated oscillator 38, chopper 26, and low-pass filter 36 function as a time-division multiplier. For the case of no interference illustrated in FIG. 2, the output of filter 36 is equal to one-half the envelope of its chopped input. Thus, the nominal output voltage is equal to one-half the input voltage to the chopper 26, and therefore, the step-up power transformer 14 is required to maintain the output voltage at the same level as the input voltage. Of course, transformer 14 may be coupled to the output of low-pass filter 36 instead of before the chopper 26 as in FIG. 1.

The output voltage from low-pass filter 36 is compared to the stable 60 Hz reference signal 51 in differential amplifier 48 and the difference between these two is the interference which is amplified and then phase compensated in phase compensation network 56. Ideally, network 56 should reduce the net phase shift around the feedback loop to zero in the useful frequency range of the system. The phase compensation is necessary to prevent the feedback signal from becoming positive during a significant portion of the 60 Hz input cycle.

The phase detection multiplier 57 converts the phase compensated output to an error signal which is used to modulate the 20 KHz oscillator pulse width. The error signal increases or decreases the duty cycle of the pulse width modulator 38 which changes the time-averaged chopper output by increasing or decreasing the closure time of switch 28 relative to switch 30. This in turn increases or decreases the amplitude of the output from low-pass filter 36. If the net phase shift around the loop is zero, the feedback (negative) will tend to drive the interference signal to zero, except for when the input signal is out of phase with its 60 Hz component. This is because the error signal cannot reverse the polarity of the input as required during this interval. To provide for this condition, the system input $V_{in}$ and 60 Hz reference signal 51 are compared in the second phase detector 60 which controls the phase reversal switching means 20 to reverse the polarity of the chopper input voltage if the two are out of phase. Even with this polarity reversal, some distortion results when the input amplitude $V_{in}$ falls below the desired output amplitude. At this point, the instantaneous chopper duty cycle is unity and the output simply follows the chopper input during this time. Additional filtering could remove this small distortion if needed.

EXAMPLES ILLUSTRATING SYSTEM PERFORMANCE

If interference in the form of an overvoltage surge is present at the input, the operation of the system is as follows. Since the instantaneous value of the interference is in phase with the 60 Hz component of the input signal $V_{in}$, the amplitude of the system output tends to increase. This increase causes a feedback signal to develop which decreases the instantaneous chopper pulse width and thus, the output during this interval. Theoretically, there is no limit to the amount of overvoltage that the system can correct for, although practically there is a hardware limitation (determined by the breakdown voltages of the chopper switches 28 and 30).

The degree of attenuation that is obtained is a nonlinear increasing function of the overvoltage amplitude. In other words, the greater the amplitude of the overvoltage surge, the greater the attenuation. Consider the case of a 500 V spike riding on top of a 170 V 60 Hz peak value of the system input signal. The instantaneous chopper duty cycle must decrease to 0.127 (from 0.5) to reduce the instantaneous peak output to 85 V. If the spike is narrow and contains high frequency components, additional attenuation is obtained via the low-pass filter 36.

Figure 3A:
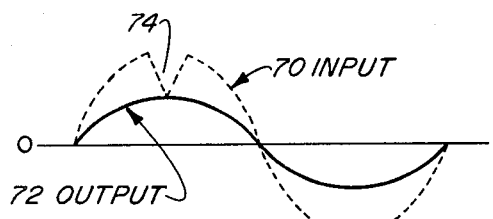
FIGS. 3a, 3b and 3c are waveforms illustrating the operation of the active bandpass filter with a sinusoidal input signal having interference in the form of an undervoltage surge.

If interference in the form of an undervoltage surge is present at the system input, there are three distinct possibilities which are illustrated in FIG. 3 where dashed curve 70 represents the wave form of the system input and solid curve 72 represents the waveform of the system output. For clarity, the waveforms in these examples are illustrated for a system which does not include the step-up transformer 14 so that the maximum amplitude of the output wave 72 is one half that of the input wave 70. In FIG. 3, the undervoltage surge 74 is assumed to be a triangular pulse which is out of phase with the 60 Hz component of the input voltage. The output waveforms 72 shown are those that would be obtained without any passive filter action. In the first case shown in FIG. 3a, the amplitude of the undervoltage surge 74 is small enough that the input 70 to the chopper 26 never falls below the desired output. Since the chopper duty cycle is not limited, the system can correct totally for the undervoltage condition, and the output 72 is not distorted.

Figure 3B:
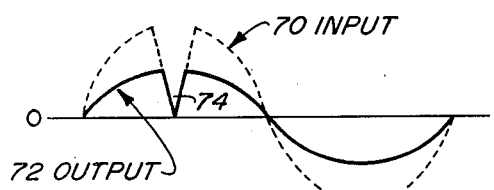

The second case, shown in FIG. 3b, represents a momentary loss of input power. This is a worst case condition which is outside the range of the active filter. When the input 70 falls below the desired output 72, the chopper duty cycle is limited at unity and the output 72 simply follows the input. In other words, there is no active filtering action, although the low-pass filter 36 on the output will provide some attenuation, if the interference pulse width is very narrow. However, the inability to compensate for momentary loss of power is not unique to this system. There is no way that any electronic system can do this without resorting to energy storage, in relatively large, passive filter components or batteries; if no input is present for an extended time, obviously no power can come through to the output.

Figure 3C:
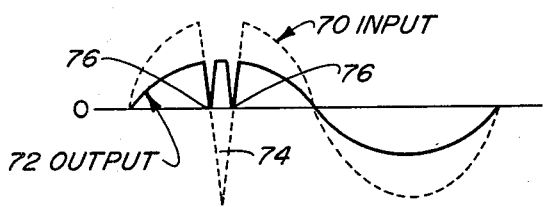

In the third case, shown in FIG. 3c, the undervoltage 74 surge is so large that the input is temporarily out of phase with its 60 Hz component. Although the system cannot completely correct for this condition, it does improve the waveform at the output 72 and make it easier to filter with passive components. Effectively, the system rectifies and limits the negative-going portion of the input surge voltage as shown in FIG. 3c. The system is unable to compensate in the region of the input wave's zero crossovers since the chopper duty cycle is limited to unity. Again, the distortion will be decreased somewhat by the output low-pass filter 36.

FIGS. 4 and 5 illustrate system waveforms for the case of an input wave with 25 percent second harmonic distortion and 25 percent third harmonic distortion, respectively. In FIGS. 4 and 5, curves 70 and 72 represent the input waveform and the output waveform, respectively, and curve 76 represents the distortion waveform.

Figure 4A:
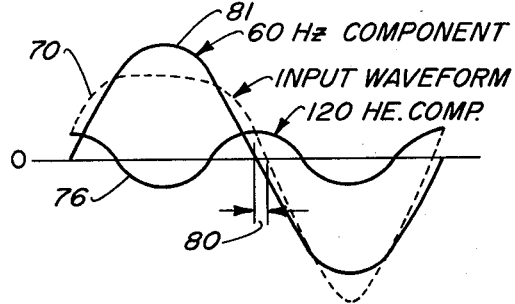
FIGS. 4a and 4b are waveforms illustrating the operation of the active bandpass filter with a sinusoidal input signal having interference in the form of second harmonic distortion.
Figure 4B:
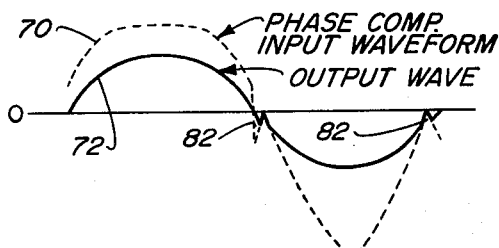

Referring now to FIGS. 4a and 4b, in the interval 80 between the zero crossovers of the input waveform 70 and its 60 Hz component 81, the phase of the 60 Hz component is reversed as shown at 82 in FIG. 4b. The system is able to correct for this distortion except during the interval when the level of the phase-reversed input falls below the desired output level, since the chopper duty cycle is limited to unity. The resultant output waveform 72 is a 60 Hz wave with distortion in the form of triangular glitches 83 at the zero crossovers of the input waveform 70. The magnitude and pulse width of these distortion glitches is, of course, dependent on the magnitude and phase of the input interference. From a phase standpoint, FIG. 4 represents a worst case condition. If the phase of the 120 Hz is shifted so that its zero crossovers coincide with the zero crossovers of the 60 Hz component, filtering is perfect and distortion glitches 83 will not occur. Although passive filtering at the output of the system will reduce the distortion somewhat, in general it cannot be removed completely with a reasonably sized filter.

Figure 5A:
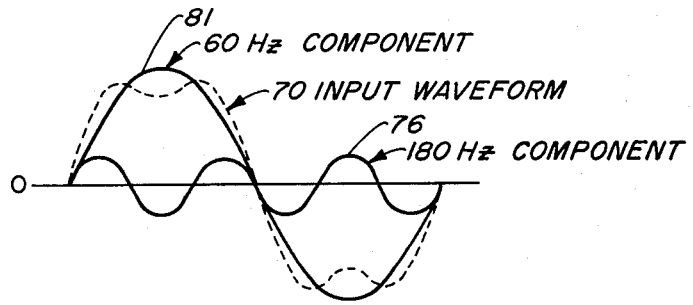
FIGS. 5a and 5b are waveforms illustrating the operation of the active bandpass filter with a sinusoidal input signal having interference in the form of third harmonic distortion.
Figure 5B:
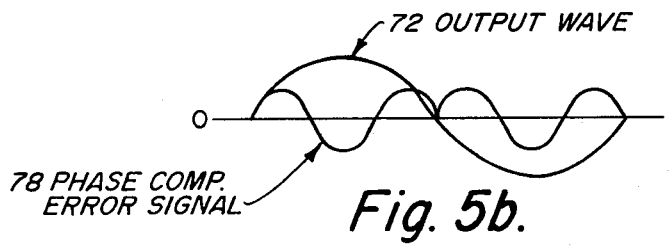

Referring now to FIGS. 5a and 5b, which illustrate the system performance for the case of an input waveform 70 having 25 percent third harmonic distortion, note that the output waveform 72 is not distorted (as is the case in the example of FIG. 4) since the zero crossover of the input waveform coincides with that of its 60 Hz component 82. Note that when the amplitude of the input waveform 70 is below that of its 60 Hz component 81, the duty cycle of the chopper must be increased during both the positive-going and negative-going portions of the input cycle. Thus, phase detection of the feedback error signal in phase detector 57 is required. Curve 84 illustrates the waveform of error signal which controls the pulse-width-modulated oscillator 38 in this situation.

Most of the system elements shown in the block diagram of FIG. 1 are conventional and well-known to those skilled in the art. However, further discussion of certain elements in the preferred embodiment is beneficial. It is first noted that the quality of the system output waveform can be no better than the reference signal 51 provided by the phase-locked loop 52. Within its dynamic range, the system is designed to produce a power output waveform which is identical to the reference waveform 51. Since this phase-locked loop may be done at low power levels, conventional, well-known techniques may be used to provide a high quality reference.

Figure 6:
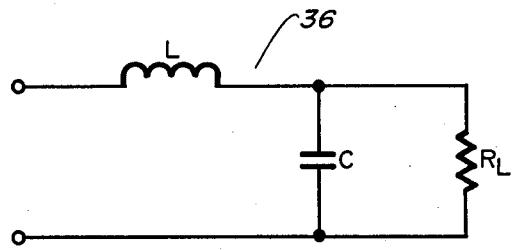
FIG. 6 illustrates a filter suitable for the low-pass filter in the embodiment of FIG. 1.

With regard to the low-pass filter 36, it is designed to remove the high chopper frequency, without attenuating the low-frequency input signal. A two-pole LC filter shown in FIG. 6 is suitable for use as low-pass filter 36. More complex filters introduce additional phase shift to the system, thus making phase compensation (at 56) and stability problems in the feedback loop more severe. Consequently, if additional high-frequency filtering is desired, it is preferable to add an additional filter at the output of the system, outside the feedback loop.

Figure 7:
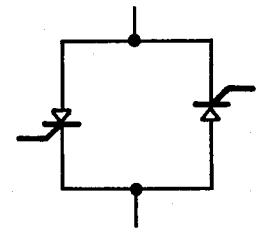
FIG. 7 illustrates a bidirectional arrangement of unidirectional switches suitable for use as a switch in the chopper switching means of the embodiment of FIG. 1.

The chopper switches 28 and 30 are the most critical components in the system. Ideally, these devices should be bidirectional, although a bidirectional circuit arrangement of unidirectional switches is acceptable. An example of this is the inverse parallel connection of Silicon Controlled Rectifiers (SCR's) as shown in FIG. 7. The chopper switches should be easy to turn on or off. In addition to being able to handle the full RMS load current, chopper switches 28 and 30 must have bidirectional breakdown voltages in excess of twice the peak system input voltage, plus reasonable overvoltage surges. Because the primary source of power losses in the system is expected to be chopper switching losses, they must have switching times which are small in comparison to the chopper period. Also, their "on" resistance must be much less than the load resistance to minimize system power losses. Based on these considerations, the following specifications are applicable for a 120 V, 100 amp system:

| | |
|---|---|
| breakdown voltage: | 1000V minimum; |
| current: | 100 amp RMS maximum; |
| switching speed: | 1μ sec. maximum; and |
| on resistance: | .01Ω maximum. |

The most promising devices for chopper applications at this time are VMOS FET's and gate turn off thryistors (GTO's).

One possible realization of the phase reversal switching means 20 is shown in FIG. 8. This consists of a bridge of bidirectional switches 90, 91, 92 and 93 each consisting of two GTO's 94 and 95 connected in inverse parallel as shown. If no phase reversal is required, switches 90 and 91 are turned "on" and 92 and 93 are "off". The opposite switching sequence is used if phase reversal is required.

The voltage breakdown requirement for the phase reversal switching means 20 is the same as for the chopper switches, but the current handling requirement is cut in half since the maximum duty cycle of any device is one half. Extreme switching speeds are not required in the phase reversal switching means 20 as they are in the chopper switching means 26.

The present invention is described in "An Active Power Bandpass Filter", authored by J. C. Bowers, J. L. Brooks, and H. A. Nienhaus, Power Electronics Specialists Conference, 1978 Record, pp. 307-316, Syracuse, N.Y., June 13-15. 1978. This publication is hereby incorporated into this disclosure.

Obviously, many modifications and variations of the present invention are possible in light of the above teachings. It is therefore to be understood that within the scope of the appended claims the invention may be practiced otherwise than as specifically described.

What is claimed is:

1. An active high power filter comprising:
   means for chopping an input signal having a primary component of a first frequency at a chopper frequency to provide a chopped signal at an output, said means for chopping being controllable for adjusting the duty cycle of the chopped output signal;
   filter means having its input coupled to the output of said means for chopping for receiving the chopped output signal and having an output, said filter means filtering the chopper frequency and allowing the passage of the first frequency of said chopped output signal to the output of said filter;
   means for providing a reference signal at the frequency of and in-phase with the primary component of said input signal;
   differential amplifier means having a first input coupled to the output of said filter means, a second input coupled to said reference signal, and an output, said differential amplifier means providing a signal related to the difference between its two inputs at its output;
   phase compensation means coupled to the output of said differential amplifier means for adjusting the phase of the output signal from said differential amplifier means;
   phase detection multiplier means having a first input coupled to the output of said phase compensation means, a second input coupled to the reference signal, and an output, said phase detection multiplier providing an output signal related to the difference between its input signals; and
   pulse-width-modulator means having its control input coupled to the output of said phase detection multiplier means and its output coupled to said means for chopping to control the duty cycle of said means for chopping, the duty cycle of said pulse-width-modulator means being controlled by the output signal from said phase-detection multiplier.

2. A filter as recited in claim 1 further comprising:
   phase reversal means having its input coupled to receive the input signal of a first frequency and having its output coupled to the input of said means for chopping, said phase reversal means being capable of reversing the phase of the input signal to the chopping means, and
   means for controlling said phase reversal means to reverse the phase of the input signal to said means for chopping when said input signal is out of phase with said reference signal.

3. A filter as recited in claim 2 further comprising:
   a power transformer having its input coupled to receive the input signal of a first frequency and having its output coupled to the input of said phase reversal means.

4. A filter as recited in claim 1 further comprising:
   a power transformer having its input coupled to receive the input signal of a first frequency and having its output coupled to the input of said means for chopping.

5. The filter as recited in claim 1 wherein said means for chopping comprises:
   a first bidirectional power switch having its input terminal coupled to one side of said input signal and its output terminal coupled to said filter means; and
   a second bidirectional power switch having its input terminal coupled to the other side of said input signal and its output terminal coupled to said filter means and the output of said first bidirectional power switch,
   the output of the pulse-width-modulator being coupled to said first and second chopper switches so that said chopper switches have opposite switching states and the switching states are alternated to provide the chopped output signal.

6. The filter as recited in claim 5 wherein each said bidirectional power switch comprises an inverse parallel arrangement of undirectional switches.

7. The filter as recited in claim 5 further comprising means for reversing the phase of the input signal to said means for chopping, said means for reversing comprising:
   a third bidirectional power switch having its input terminal coupled to one side of said input signal and its output terminal coupled to input terminal of said first bidirectional power switch;
   a fourth bidirectional power switch having its input terminal coupled to the other side of said input signal and its output terminal coupled to the input terminal of said second bidirectional power switch;
   a fifth bidirectional power switch having its input terminal coupled to said other side of said input signal and its output terminal coupled to the input terminal of said first bidirectional power switch; and
   a sixth bidirectional power switch having its input terminal coupled to said one side of said input signal and its output terminal coupled to the input terminal of said second bidirectional power switch,
   the third and fourth bidirectional power switches being open and the fourth and fifth bidirectional power switches being closed for no phase reversal and each being in the opposite state to reverse the phase of the input signal to the means for chopping.

8. The filter as recited in claim 7 wherein said third, fourth, fifth and sixth bidirectional power switches each comprises an inverse parallel arrangement of unidirectional switches.

* * * * *